United States Patent
Alazzam et al.

(10) Patent No.: US 12,507,605 B2
(45) Date of Patent: Dec. 23, 2025

(54) LOW COST GRAPHENE-BASED MICRODEVICES WITH MULTI-STATE RESISTIVE VALUES

(71) Applicant: Khalifa University of Science and Technology, Abu Dhabi (AE)

(72) Inventors: Anas Alazzam, Abu Dhabi (AE); Heba Abunahla, Abu Dhabi (AE); Baker Mohammad, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 722 days.

(21) Appl. No.: 17/288,306

(22) PCT Filed: Oct. 29, 2019

(86) PCT No.: PCT/IB2019/059260
§ 371 (c)(1),
(2) Date: Apr. 23, 2021

(87) PCT Pub. No.: WO2020/089786
PCT Pub. Date: May 7, 2020

(65) Prior Publication Data
US 2021/0384425 A1    Dec. 9, 2021

Related U.S. Application Data

(60) Provisional application No. 62/752,389, filed on Oct. 30, 2018.

(51) Int. Cl.
*H10N 70/00* (2023.01)
*H10N 70/20* (2023.01)

(52) U.S. Cl.
CPC ......... *H10N 70/883* (2023.02); *H10N 70/063* (2023.02); *H10N 70/24* (2023.02); *H10N 70/823* (2023.02); *H10N 70/253* (2023.02)

(58) Field of Classification Search
CPC .... H10N 70/883; H10N 70/24; H10N 70/823; H10N 70/8845; H10N 70/20; H10N 70/253
See application file for complete search history.

(56) References Cited

U.S. PATENT DOCUMENTS 9,129,887 B2 * 9/2015 Jo ................ H10N 70/884
11,209,406 B2 * 12/2021 Yanagisawa ........ G01N 30/72
(Continued)

FOREIGN PATENT DOCUMENTS

CN    103196962 A * 7/2013 ........... G01N 27/26
CN    103490009 A * 1/2014 ........... H10N 70/883
(Continued)

*Primary Examiner* — Ida M Soward
(74) *Attorney, Agent, or Firm* — Hayes Soloway PC

(57) ABSTRACT

A planar graphene oxide (GO)-based device including multiple resistance state elements in response to an applied voltage and wherein the multiple resistance state elements mimic neural synapse behavior. The device has multiple application potentials including but not limited to non-volatile electronic memory, sensors, computing for Artificial intelligence (AI) and security. Also disclosed is method of manufacturing a memristor microdevice comprising the steps of patterning metal layer and graphene oxide or reduced graphene oxide thin films on different substrates and producing reduced graphene oxide (rGO) thin film through reduction of the graphene oxide layer. Fabricating thin films of graphene oxide and reduced graphene oxide in the microdevice from an aqueous solution of graphene oxide, results in making the process simple, cost effective, and suitable for mass production of the microdevice.

5 Claims, 9 Drawing Sheets

(56) References Cited

U.S. PATENT DOCUMENTS

| | | | | |
|---|---|---|---|---|
| 2011/0240946 A1* | 10/2011 | Miao | ...................... | H10N 70/253 |
| | | | | 977/734 |
| 2011/0291068 A1* | 12/2011 | Kobayashi | ........ | H01L 29/66742 |
| | | | | 977/734 |
| 2012/0058350 A1* | 3/2012 | Long | ...................... | B82Y 10/00 |
| | | | | 428/688 |
| 2012/0205606 A1* | 8/2012 | Lee | ........................ | H10N 70/20 |
| | | | | 977/734 |
| 2012/0228597 A1* | 9/2012 | Robinson | ............... | B82Y 40/00 |
| | | | | 257/E51.026 |
| 2013/0092904 A1* | 4/2013 | Ushikura | ............... | H10K 10/84 |
| | | | | 977/734 |
| 2013/0306934 A1* | 11/2013 | Lee | .................... | G01N 33/5438 |
| | | | | 257/E51.038 |
| 2014/0042494 A1* | 2/2014 | Han | ................... | H01L 29/42332 |
| | | | | 428/323 |
| 2014/0284552 A1* | 9/2014 | Kub | ................... | H01L 29/66068 |
| | | | | 257/26 |
| 2016/0060120 A1* | 3/2016 | Hu | ...................... | C23C 14/5846 |
| | | | | 204/192.15 |
| 2016/0315194 A1* | 10/2016 | Khan | ................. | H10D 30/6758 |
| 2017/0014778 A1* | 1/2017 | Park | ...................... | B01D 69/105 |
| 2017/0047512 A1* | 2/2017 | Bessonov | .............. | H10N 70/24 |
| 2017/0323929 A1* | 11/2017 | Bessonov | ............. | H10B 63/30 |

FOREIGN PATENT DOCUMENTS

| | | | | | |
|---|---|---|---|---|---|
| CN | 104916777 | A | | 9/2015 | |
| CN | 104316086 | B | * | 10/2017 | ................ G01D 5/16 |
| CN | 104916777 | B | * | 11/2017 | ........... H10N 70/253 |
| CN | 107966586 | A | * | 4/2018 | ................ G01P 5/08 |
| CN | 108428794 | A | | 8/2018 | |
| EP | 3016178 | A1 | * | 5/2016 | .............. H01M 6/40 |
| KR | 20110081683 | A | * | 7/2011 | ............. H10D 10/00 |
| KR | 20120086621 | A | * | 8/2012 | .......... H01L 29/0843 |
| KR | 20130042845 | A | * | 4/2013 | .............. B01J 19/14 |
| WO | WO-2012169720 | A1 | * | 12/2012 | ............. H10D 30/47 |
| WO | WO-2013116273 | A1 | * | 8/2013 | ......... G11C 13/0002 |

* cited by examiner

LOW COST GRAPHENE-BASED MICRODEVICES WITH MULTI-STATE RESISTIVE VALUES

CROSS-REFERENCE TO RELATED APPLICATIONS AND PRIORITY

This patent application claims priority from PCT Patent Application No. PCT/IB2019/059260 filed Oct. 29, 2019, which claims priority from U.S. Provisional Patent Application No. 62/752,389 filed Oct. 30, 2018. Each of these patent applications are herein incorporated by reference in their entirety.

FIELD OF THE INVENTION

The present invention relates to the field of graphene-based microdevices, and more particularly to a planar graphene oxide (GO)-based memristor device.

BACKGROUND OF THE INVENTION

Graphene is a two-dimensional crystal of carbon atoms with unique electrical, mechanical, optical, and thermal properties that makes it ideal for enormous applications and one of the most exciting materials in the 21st century. The first method to prepare graphene sheet was reported by Andre Geim and Konstantin Novoselov in 2004. The unusual properties of graphene such as stability under ambient temperature, high electrical conductivity, flexibility, and high surface area makes it very promising candidate to substitute metal electrodes. Reduced graphene oxide (rGO) is a form of graphene which is produced by reducing graphene oxide (GO) to remove the oxygen-containing groups. Reducing graphene oxide is one of the most effective methods to manufacture graphene in sufficient quantities. The reduction of GO could be achieved by several methods based on thermal, chemical or electrical treatments. The quality of the rGO flakes to be akin to graphene depends on the techniques used in reduction. Chemical reduction of graphene oxide opens a route for mass scale production of graphene (rGO).

Recently, there has been great interest in graphene (G)-based electronics for many applications. Bio-inspired electronic devices with analog behavior have many advantages over conventional silicon-based technologies that demonstrate static digital properties. This is due to their ability to compute, process and hold information in parallel; which improves speed, storage density and power consumption of the system. Bio-inspired neuromorphic devices are of great importance in many emerging applications; such as image and pattern recognition, machine learning and Artificial Intelligence (AI). Memristor devices are important elements in such technologies due to their non-volatility and ability to demonstrate multiple resistance levels.

SUMMARY OF THE INVENTION

Therefore it is an object of the present invention to provide a planar graphene oxide (GO)-based memristor device that exhibits conductivity change with an effective range of resistance levels.

The present invention involves a planar graphene oxide (GO) based device, wherein the planar graphene oxide (GO) based device comprises a memristor structure enabling the device to have an electrical behavior characterized in having multiple resistance levels in response to an applied voltage.

In another embodiment of the present invention, the electrical behavior enables the device to store data and be used as a single bit or multiple bit random access memory (RAM).

In another embodiment of the present invention, the electrical behavior enables the device to perform data processing.

In another embodiment of the present invention, the electrical behavior demonstrates a retention displayed by absence of overlap between consecutive I-V (current voltage) sweeps.

In another embodiment of the present invention, electrical behavior of the device provides a clear distinction between the multiple resistance levels.

In another embodiment of the present invention, the device comprises a reduced graphene oxide thin film patterned on a substrate.

As another aspect of the present invention is disclosed a method of manufacturing a memristor device, comprising the steps of producing a graphene oxide layer on a substrate, patterning the graphene oxide layer, reducing the graphene oxide layer to produce a reduced graphene oxide (rGO) thin film; and producing a patterned metal layer on top of the reduced graphene oxide layer.

In another embodiment of the present invention, a method of manufacturing a memristor device is disclosed, comprising the steps of producing a graphene oxide layer on a substrate, reducing the graphene oxide layer to produce a reduced graphene oxide (rGO) thin film; and producing a patterned metal layer on top of the reduced graphene oxide layer.

In another embodiment of the present invention, a method of manufacturing a memristor device is disclosed, comprising the steps of producing a patterned metal layer on top of a substrate, producing a graphene oxide layer on top of the substrate with the metal patterned layer, patterning the graphene oxide layer; and reducing the graphene oxide layer to produce a reduced graphene oxide (rGO) thin film.

In another embodiment of the present invention, the patterning the metal layer and the reduced graphene oxide thin films on different substrates is performed using a microfabrication technique.

In another embodiment of the present invention, the reduced graphene oxide thin film is produced using a liquid-phase solution of graphene oxide.

In another embodiment of the present invention, the producing a patterned graphene oxide layer on a substrate comprises coating the substrate with a photoresist layer, patterning the photoresist layer using photolithography on the substrate, developing the photoresist layer using a chemical to produce a patterned photoresist, treating the substrate with plasma to produce a treated substrate, applying a graphene oxide solution on top of the treated substrate to form a graphene oxide layer on said treated substrate, spinning and heating the treated substrate with the graphene oxide layer on said treated substrate; and removing the photoresist layer to form a patterned graphene oxide film.

In another embodiment of the present invention, the reducing the graphene oxide layer to produce a reduced graphene oxide (rGO) thin film on different substrates comprises reducing the graphene oxide layer on the treated substrate to produce the reduced graphene oxide film.

In another embodiment of the present invention, the substrate is a polymer substrate.

In another embodiment of the present invention, the substrate is a cyclic olefin copolymer (COC) substrate.

In another embodiment of the present invention, the plasma is $O_2$ plasma.

In another embodiment of the present invention, the photoresist layer coated on the polymer substrate is baked prior to the patterning the photoresist layer on the substrate.

In another embodiment of the present invention, the photoresist layer is Shipley PR1813.

In another embodiment of the present invention, the treated substrate is spun subsequent the deposition of the graphene oxide layer.

In another embodiment of the present invention, the treated substrate is baked subsequent the coating of the substrate with graphene oxide.

In another embodiment of the present invention, the treated substrate is sonicated subsequent to removing the photoresist layer on the treated substrate using acetone.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which—

FIG. 7 (b) is a graphical representation of consecutive positive sweeps.

FIG. 8 (b) is a graphical representation of consecutive negative sweeps.

DETAILED DESCRIPTION OF THE INVENTION

The aspects of a planar graphene oxide (GO)-based memristor device that exhibits conductivity change with an effective range of resistance levels according to the present invention, will be described in conjunction with FIGS. 1-10. In the Detailed Description, reference is made to the accompanying figures, which form a part hereof, and in which is shown by way of illustration specific embodiments in which the invention may be practiced. It is to be understood that other embodiments may be utilized and logical changes may be made without departing from the scope of the present invention. The following detailed description, therefore, is not to be taken in a limiting sense, and the scope of the present invention is defined by the appended claims.

The present invention relates to a novel planar graphene oxide (GO)-based device that exhibits conductivity change with an effective range of resistance levels. The electrical behavior of the planar graphene oxide (GO)-based device demonstrates excellent retention displayed by an absence of the overlap between the consecutive I-V sweeps. This provides clear distinction between the multiple resistance states obtained by the application of each voltage sweep. The variable resistance level in the memristive junction formed at the interface between metal electrodes is directly related to the synapse plasticity change in the brain. Graphene based microdevices (or memristor devices) exhibiting multi-state resistive values enables support of memory or storage capabilities along with information processing capabilities due to the presence of a resistive random access memory (RAM). This feature further makes the planar graphene oxide (GO)-based memristor promising for in memory computing (IMC), machine learning and neuromorphic applications.

The memristor microdevice in accordance with the present invention is fabricated using a simple and repeatable method. In this method, metal layer and graphene oxide or reduced graphene oxide thin films are patterned on different substrates following which photolithography is successfully used to pattern solution-based graphene oxide thin films on the substrates. Reduced graphene oxide (rGO) thin film is produced through the reduction of graphene oxide layer, as this is the most effective method to sufficiently manufacture graphene in adequate quantities. Accordingly, fabricating thin films of graphene oxide (GO) and reduced graphene oxide (rGO) in the microdevice from an aqueous solution of graphene oxide makes the process simple, cost effective, and suitable for mass production of the microdevice. The metal electrodes are patterned using photolithography through etching or liftoff processes.

Figure 1:
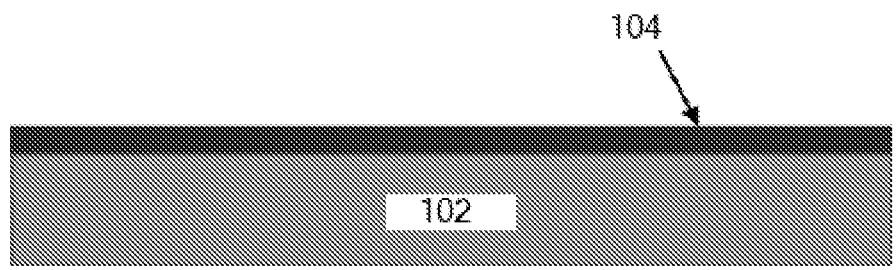
FIG. 1 (a)-(d) shows initial steps for manufacturing a patterned graphene oxide film and graphene film from a graphene oxide solution in accordance with the present invention.
Figure 1:
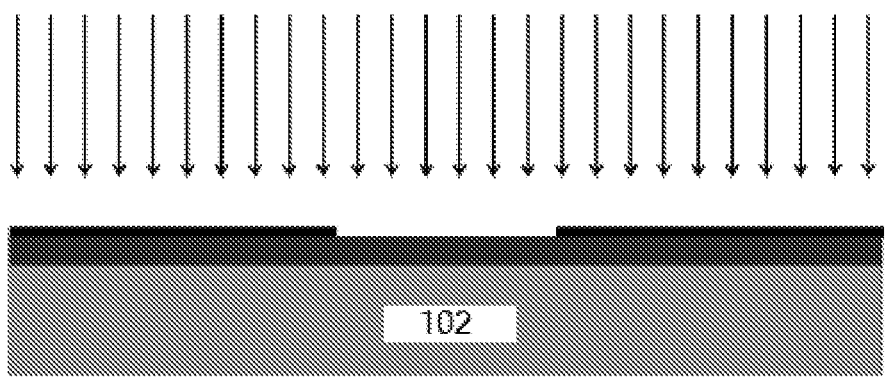
Figure 1:
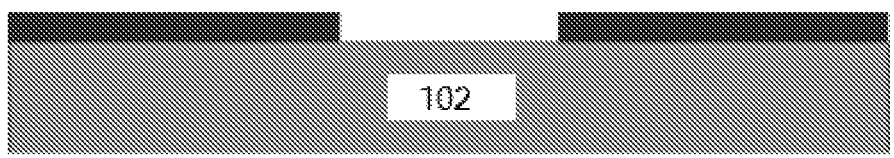
Figure 1:
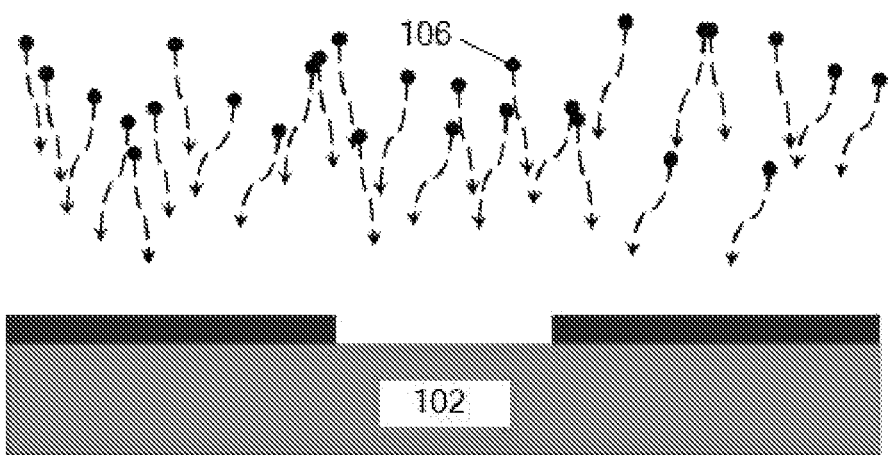
Figure 2:
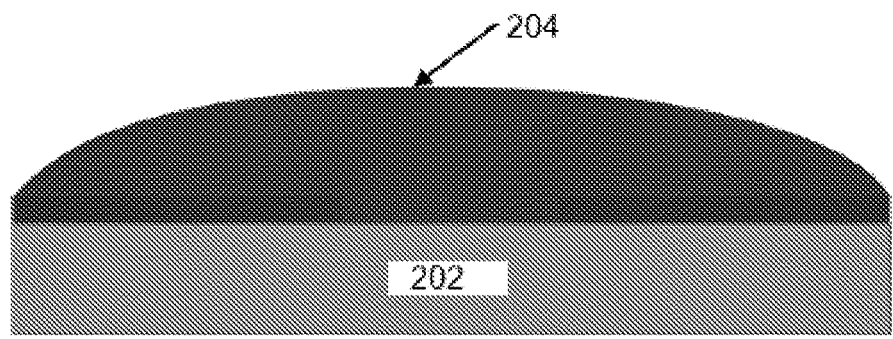
FIG. 2 (a)-(c) shows intermediate steps for manufacturing a patterned graphene oxide film and graphene film from a graphene oxide solution in accordance with the present invention.
Figure 2:
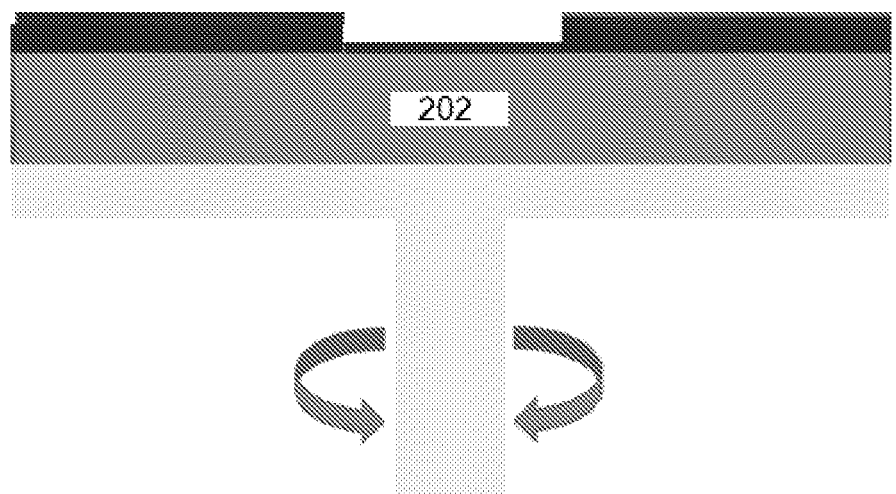
Figure 2:
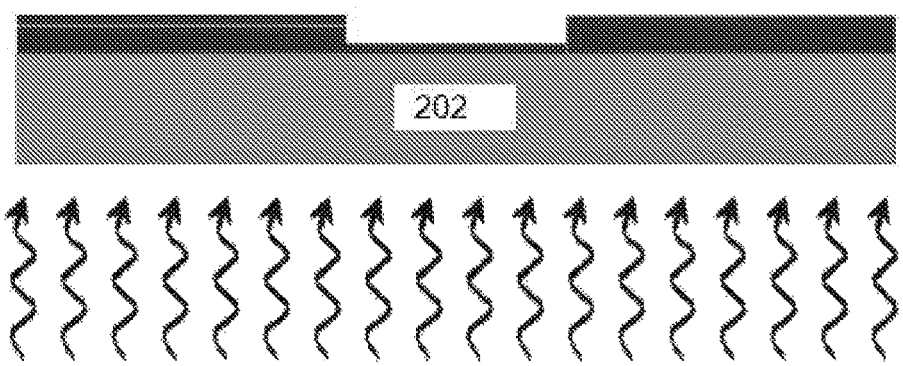
Figure 3:
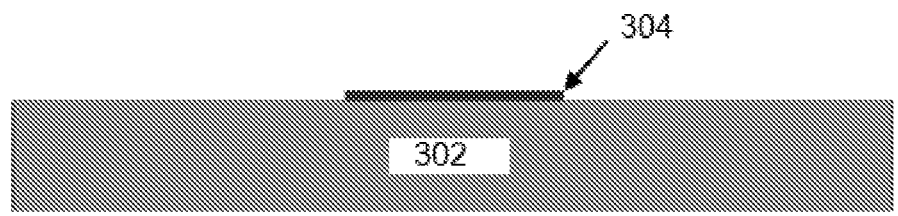
FIGS. 3 (a) and (b) denotes the final steps for manufacturing a patterned graphene oxide film and graphene film from a graphene oxide solution in accordance with the present invention.
Figure 3:
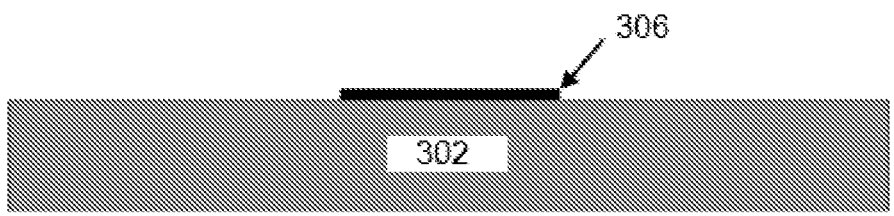
Figure 4:
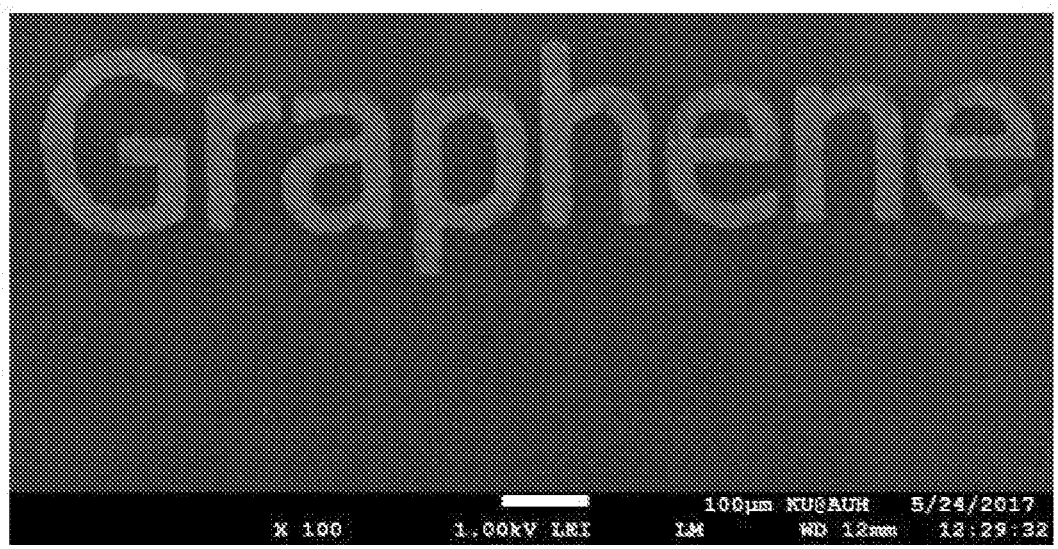
FIG. 4 is an SEM photograph of the word 'Graphene' made of graphene on top of a cyclic olefin copolymer (COC) substrate.
Figure 5:
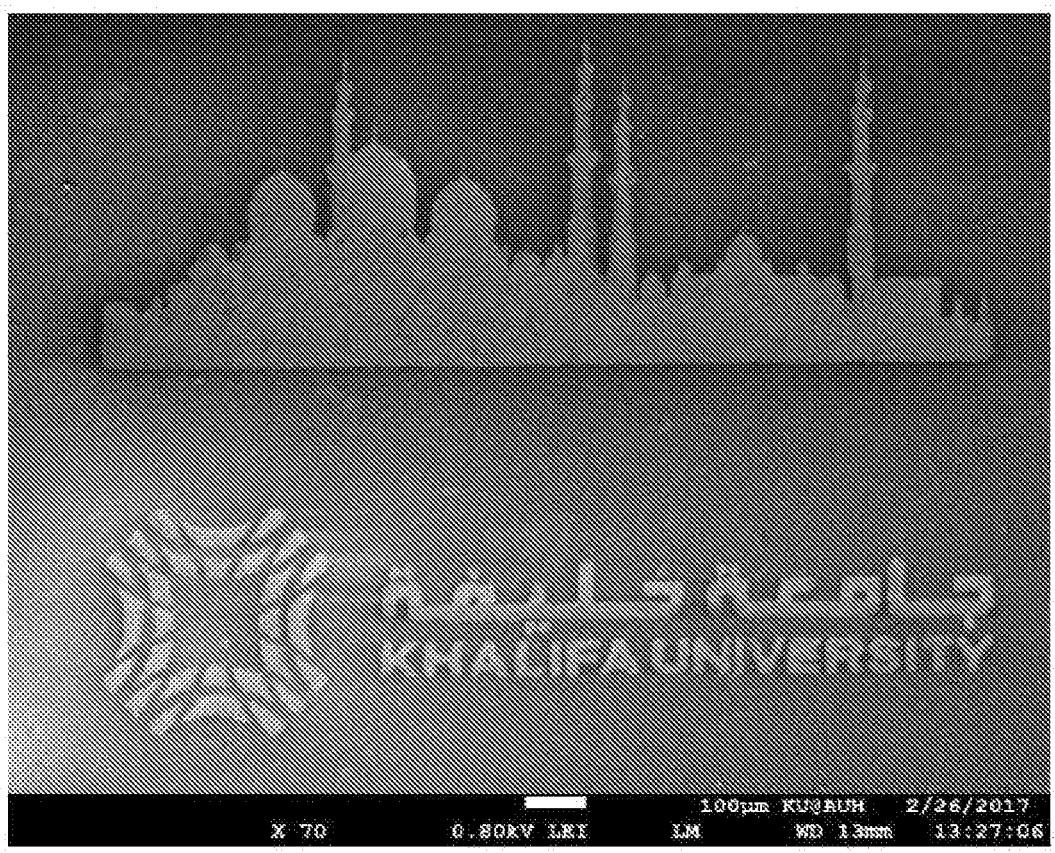
FIG. 5 is an SEM picture for Sheikh Zayed mosque and the logo of Khalifa University made of graphene thin layer on top of the cyclic olefin copolymer (COC) substrate.

In accordance with another embodiment of the present invention, a method for manufacturing a patterned graphene oxide film and graphene film from a graphene oxide solution includes the following steps. The steps included in this method as depicted in FIG. 1 (a)-(d) comprise the steps of coating a photoresist layer 104 on a substrate 102, patterning the photoresist layer 104 on the substrate 102 obtained through the previous step using photolithography. Following this, the photoresist layer on the substrate obtained through the previous step is developed using the proper chemical to produce a patterned photoresist and the substrate obtained through the previous step is treated with plasma 106. Subsequent to these initial steps, as depicted in FIG. 2 (a)-(c), intermediate steps in the manufacturing process include the graphene oxide solution 204 being dispensed on top of the substrate 202 obtained through the previous step, and the substrate 202 obtained in the previous step being spun at a proper speed and heated at a proper temperature. Further, FIGS. 3 (a) and (b) denote the final steps as the photoresist on the substrate 302 obtained through the previous step being stripped off using a proper chemical to form a patterned graphene oxide film 304 and the graphene oxide layer being reduced to produce reduced graphene oxide (graphene) film 306.

The proposed device may be fabricated without patterning the GO layer by producing a rGO layer and subsequently producing a patterned metal layer on top of it.

In accordance with a preferable embodiment of the present invention, a method of manufacturing a memristor is disclosed, comprising the steps of producing a graphene oxide layer on a substrate, patterning the graphene oxide layer, reducing the graphene oxide layer to produce a reduced graphene oxide (rGO) thin film and producing a patterned metal layer on top of the reduced graphene oxide layer. The fabrication steps may differ. In another embodiment, the method of manufacturing a memristor device in accordance with the present invention comprises the steps of producing a graphene oxide layer on a substrate, reducing the graphene oxide layer to produce a reduced graphene oxide (rGO) thin film and producing a patterned metal layer on top of the reduced graphene oxide layer. Another variation of the fabrication steps involves a method of manufacturing a memristor comprising the steps of producing a patterned metal layer on top of a substrate, producing a graphene oxide layer on top of the substrate with the metal patterned layer, patterning the graphene oxide layer and reducing the graphene oxide layer to produce a reduced graphene oxide (rGO) thin film.

Considering an example in accordance with the present invention, the manufacturing of a patterned graphene film comprises the steps of coating a Shipley PR1813 photoresist layer on a cyclic olefin copolymer (COC) substrate and then baking the same at 70o C for 3 minutes. Then, the photoresist layer on the substrate obtained through the previous step is patterned using a lithography system (Dilase 650). Dilase 650 is a high resolution direct laser lithography system equipped with different laser beams. The machine is used to pattern photoresist i.e. photosensitive material. The photoresist is patterned either by a photolithography machine (Dilase 650) or through a mask and an ultra-violet (UV) exposure system. The second method requires preparing a mask, which is usually prepared by a lithography machine. However, by using the lithography system, one can pattern the photoresist using a CAD drawing. The process is similar to a printing process but at a very high resolution and using laser beams.

Then, the photoresist layer on the cyclic olefin copolymer (COC) substrate obtained through the previous step is developed using the development (MF 319) and the substrate obtained through the previous step is treated with O2 plasma for 4 minutes. MF 319 is a chemical that used to develop or etch the photoresist (Shipley PR1813 in accordance with the present invention), designed for high resolution semiconductor fabrication. The development process is performed by immersing the wafer with the photoresist layer on it into the developer (MF 319), subsequent to ultra-violet (UV) exposure. The developer MF 319 will etch or remove the photoresist in a controlled manner. The PR1813 is positive photoresist and chemical structure changes and becomes more soluble in the MF 319 photoresist developer when the photoresist is exposed to the ultra-violet (UV) light. The pattern is printed using the photolithography system (Dilase 650) which makes the photoresist material soluble into the developer in the areas intends to remove. The printed (exposed) region is washed out using the MF 319 developer by immersing the wafer into the developer.

Further, graphene oxide solution is dispensed on top of the cyclic olefin copolymer (COC) substrate obtained through the previous step, following which the substrate obtained through the previous step is spun at 1000 rpm for 2 minutes and heated at 60° C. for 10 minutes. Subsequent to this, the photoresist on the substrate obtained through the previous step is stripped off using acetone and sonicated (subjected to ultrasonic vibrations to fragment the cells, macromolecules, and membranes) for 10 minutes to remove all the photoresist from the substrate. The graphene oxide layer is reduced using hydriodic acid—a highly acidic aqueous solution of hydrogen iodide (HI)—to produce a graphene film, the patterned graphene film being shown in FIG. 4.

Considering another example in accordance with the present invention, the manufacturing of patterned graphene film comprises the steps of coating Shipley PR1813 photoresist layer on a cyclic olefin copolymer (COC) substrate and then baking the same at 50° C. for 5 minutes. Then, the photoresist layer on the substrate obtained through the previous step is patterned using a lithography system (Dilase 650). Further, the photoresist layer on the cyclic olefin copolymer (COC) substrate obtained through the previous step is developed using the development (MF 319) and the substrate obtained through the previous step is treated with O2 plasma for 3 minutes. Following this, graphene oxide solution is dispensed on top of the cyclic olefin copolymer (COC) substrate obtained through the previous step and the substrate obtained through the previous step is spun at 1000 rpm for 2 minutes and heated at 60° C. for 5 minutes.

The photoresist layer coated on the cyclic olefin copolymer (COC) substrate is baked prior to patterning the photoresist layer on the cyclic olefin copolymer (COC). This is very well known process in photolithography. The substrate is baked "soft bake" and "hard bake". The first is prior exposure to UV and the second is after the exposure. Then, the photoresist on the substrate obtained through the previous step is stripped off using acetone and sonicated for 2 minutes to remove all the photoresist from the substrate. The graphene oxide layer is then reduced using hydriodic acid—a highly acidic aqueous solution of hydrogen iodide (HI), to produce graphene film, the patterned graphene film being shown in FIG. 5.

The order of the steps in the fabrication process could be changed. Photoresist layer could be easily changed and other substrates also work. Baking may be performed at different temperatures and durations.

Figure 6:
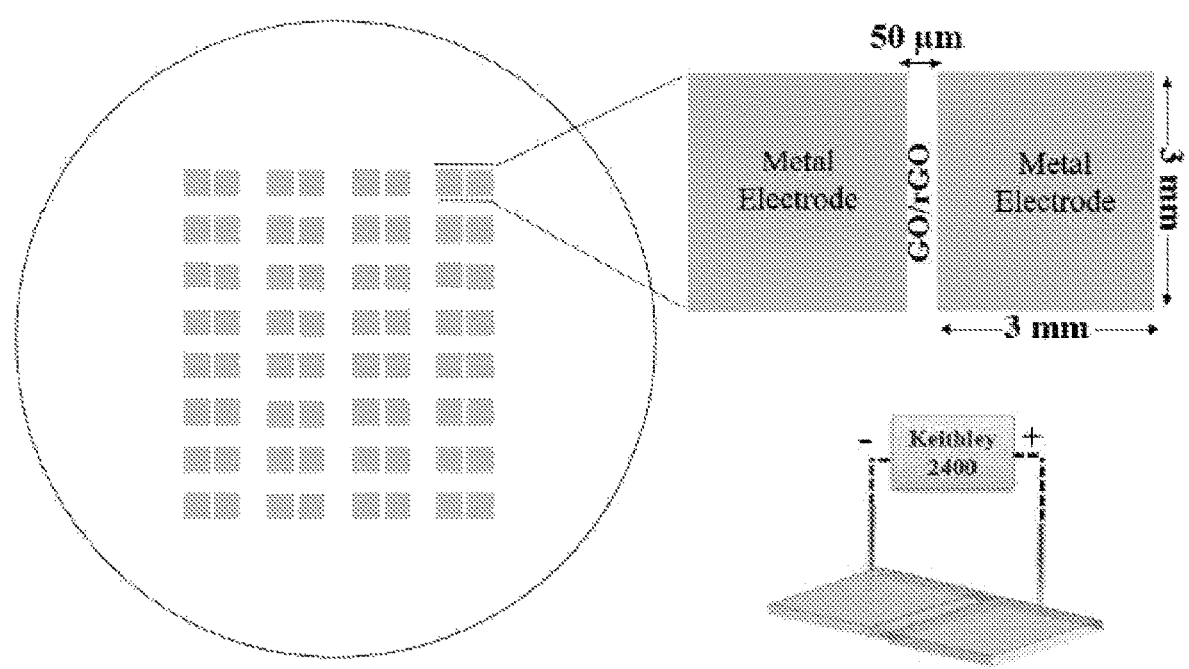
FIG. 6 depicts a Planar Graphene Oxide-Based Memristor in accordance with the present invention.

FIG. 6 depicts the device or wafer illustration of the planar graphene oxide-based memristor in accordance with the present invention.

In an embodiment of the present invention, electrical behavior of the planar graphene oxide (GO) based memristor device demonstrates excellent retention displayed by the absence of the overlap between the consecutive I-V (current-voltage) sweeps.

In another embodiment of the present invention, electrical behavior of the planar graphene oxide (GO) based memristor device provides clear distinction between the multiple resistance states obtained by application of each voltage sweep.

Figure 7:
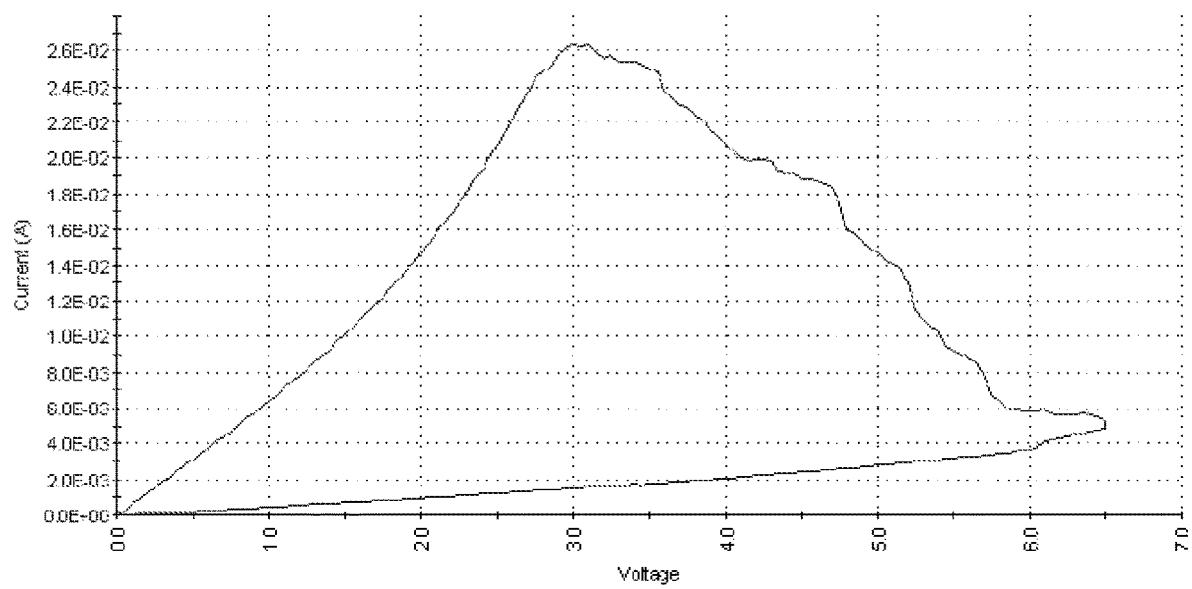
FIG. 7 (a) is a graphical representation of a single positive sweep.
Figure 7:
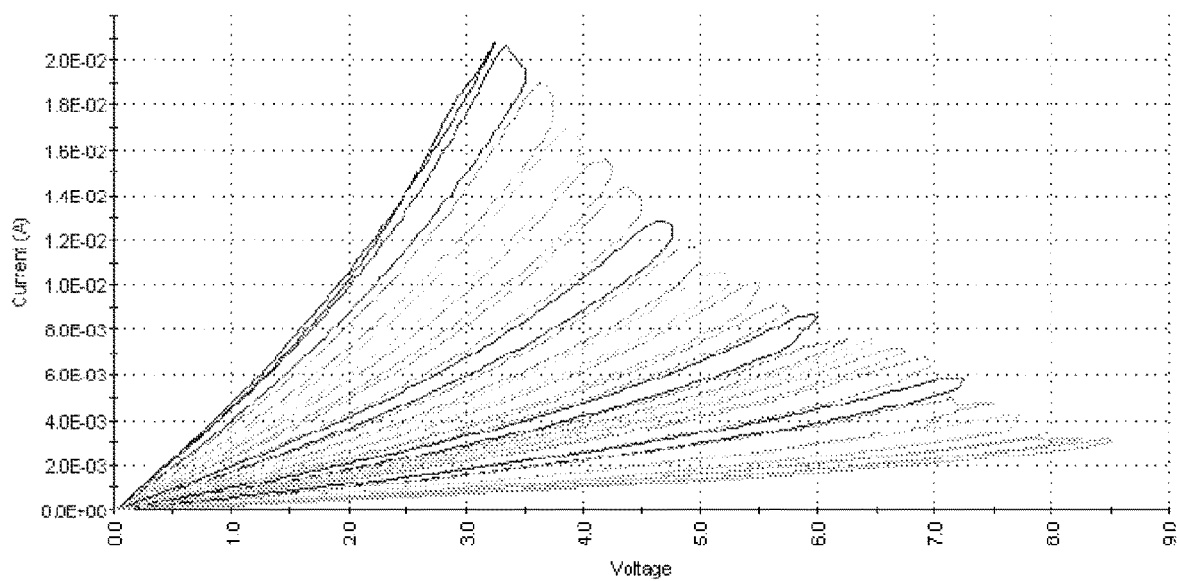
Figure 8:
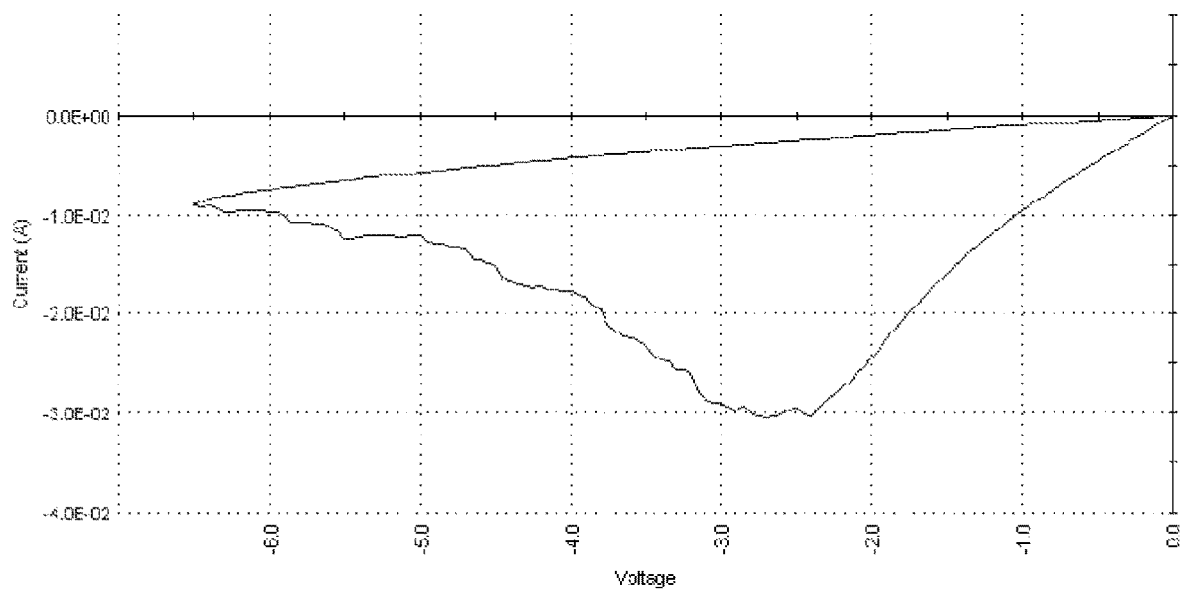
FIG. 8 (a) is a graphical representation of a single negative sweep.
Figure 8:
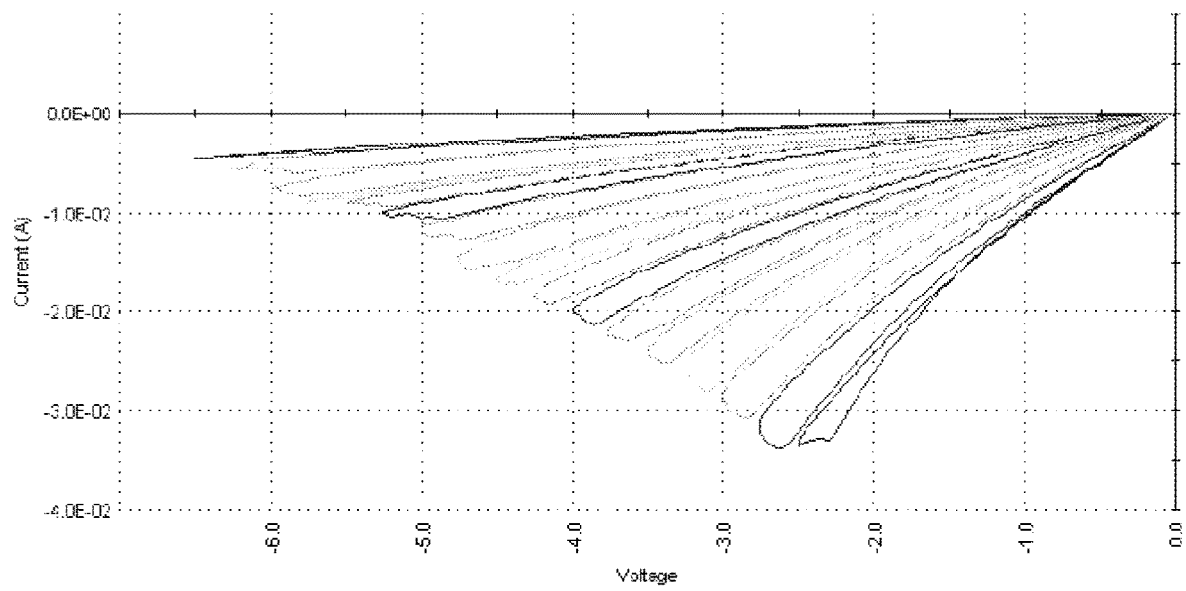

Accordingly, FIG. 7 (a) is a graphical representation of a single positive sweep, FIG. 7 (b) is a graphical representation of consecutive positive sweeps, FIG. 8 (a) is a graphical representation of a single negative sweep and FIG. 8 (b) is a graphical representation of consecutive negative sweeps.

The GO-based memristor device presented in this patent is the first to demonstrate multiple resistance states that mimic the neural synapse behavior. The device unique characteristics of having multiple resistance state element in response to applied voltage makes it a good candidate for various application in electronics industry. Several examples of such applications include—multi bit non-volatile Resistive memory for Programmable Read-only-memory (ROM)—similar to Flash with but with limited writability and in—memory computing. There is great interest for resistive random access memory (RRAM) in machine learning and artificial intelligence (AI) wherein inherent parallelism and small device sizes will provide high throughputs with low power. An application of the developed rGO film is to use it as conductive film.

The type of resistive memory achieved through the material in accordance with the present invention enables data to be stored as a resistance state and to be combined with other signals represented by a voltage, in order to carry on any function. Other applications include sensing applications especially when compound with other materials which transfer environment variables into voltages, following which the voltages are translated into resistances and variable or tunable resistors—which are needed for many Analog and RF circuits to implement high speed and reliable circuits.

Figure 9:
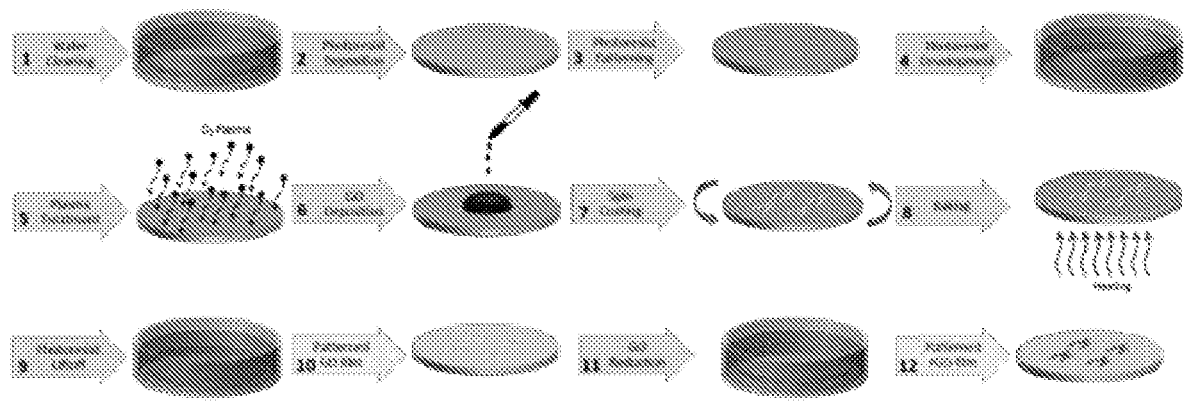
FIG. 9 shows an example of the fabrication steps of a patterned rGO (reduced graphene oxide) thin film, in accordance with the present invention.

In another embodiment of the present invention, a schematic describing the fabrication process of patterned rGO thin film is shown in FIG. 9. Initially, a substrate is cleaned by sonicating it in an isopropanol bath for ten minutes (step 1). The substrate is then dried with compressed nitrogen and baked on top of a hotplate at 70° C. for ten minutes. Next, a thin photoresist layer is deposited on top of the substrate using a spin coater (Step 2). The photoresist layer is then patterned using a photolithography system and developed using a suitable developer (steps 3 and 4). Following the development of the photoresist layer, the substrate is washed with deionized water, backed at 70° C., and then treated with oxygen plasma for three minutes to increase surface wettability (step 5). Immediately after the treatment with plasma, GO aqueous solution is dispersed on top of the patterned photoresist layer using a pipette then uniformly spread on the substrate using a spin coater (steps 6 and 7). Next, the substrate is baked for ten minutes at 70° C. to evaporate the water and improve the adhesion of the GO flakes to the substrate (step 8). The following step involves immersing the substrate in an acetone bath to remove the photoresist layer (step 9). The substrate is then washed with deionized water, dried with compressed nitrogen, and baked at 70° C. for ten minutes. At this stage the GO thin film has been patterned on top of the substrate (step 10). The last step of this fabrication process is to reduce the GO thin film to rGO by immersing the substrate in hydroiodic acid for three hours to get a patterned rGO film (steps 11 and 12).

The main goal of this work is to fabricate patterned, flexible, conductive films of rGO and use them for lab-on-chip applications. The ability to use the liftoff approach to pattern GO from a solution form makes the fabrication method simple, repeatable, and low cost. It also allows for the use of conventional photolithography methods, thus enabling mass production and eliminating the need to use toxic chemicals. Using polymer substrates brings about the advantage of being flexible, disposable, and transparent. Cyclic olefin copolymer (COC) material is increasingly used as a substrate for microfluidic devices. This work investigates the use of COC substrates/films plus the liftoff method assisted by plasma treatment and ultrasonic vibration to fabricate graphene-based electrodes for lab-on-chip applications. Different patterns of rGO films were fabricated on COC substrates. The GO film was initially patterned on the substrate then chemically reduced to rGO.

Several rGO films were fabricated using the fabrication process shown in FIG. 9. PR1813 photoresist (MicroChem) was deposited on the COC substrate (Sirris.be) using a spin coater (WS650Hzb-23NPP UD-3 from Laurell Technologies Corporation). The photoresist layer was backed at 70° C. for five minutes then patterned using a photolithography system (Dilase 650 from Moe). The photoresist layer was exposed to UV light as recommended by the supplier. The substrate was then cleaned, baked, and treated with oxygen plasma (PDC-002 from Harrick Plasma) for three minutes before a thin film of GO (4 mg/ml dispersion in water from Sigma Aldrich) was deposited using a spin coater. The plasma treatment of the patterned substrate increases its wettability, thus improving the bond force between the GO flakes and the COC substrate. The substrate was then backed at 70° C. for 10 minutes using a hotplate in order to improve the adhesion of the GO flakes to the substrate and to remove any remaining water. Next, liftoff was performed by soaking the substrate in acetone and sonicating it briefly using a sonicator (Thomas Scientific) to dissolve the photoresist layer. The wafer was then rinsed with ethanol and dried using compressed nitrogen. Finally, the patterned GO film was chemically reduced to rGO by immersing the substrate in hydroiodic acid (Sigma Aldrich) for three hours.

Figure 10:
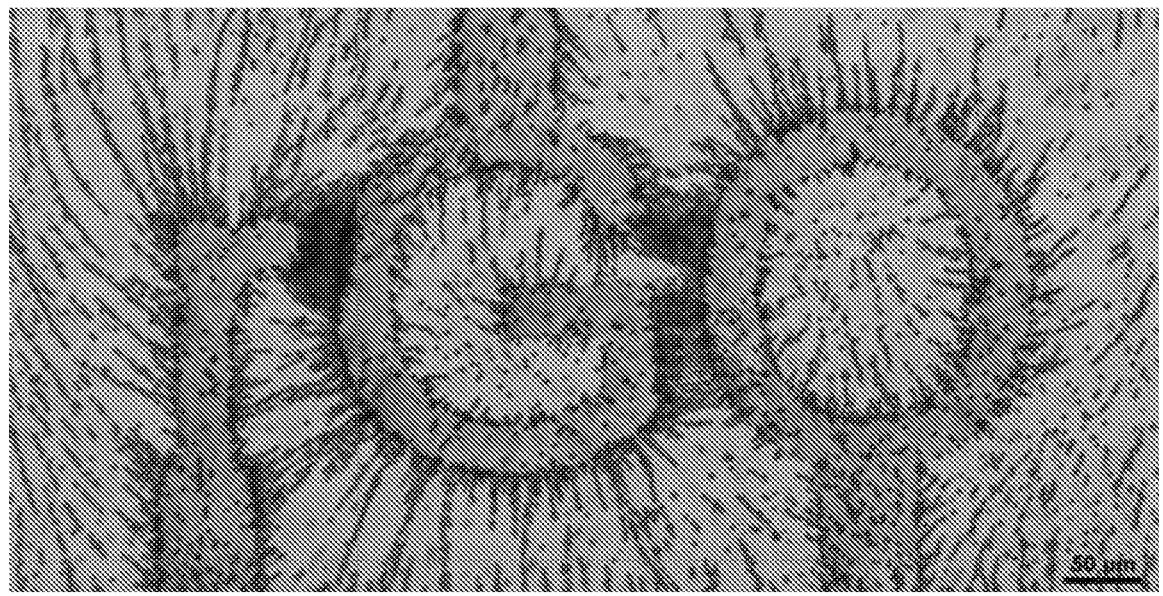
FIG. 10 depicts an example of using rGO as electrodes, in accordance with the present invention.

FIG. 10 shows the aggregation of cells due to pDEP (a phenomenon called positive DEP) at 5 Vpp at 1 MHz. The three electrodes shown in FIG. 10 are made from rGO and connected in sequence to AC function generator terminals ("r" and "0" to one terminal, while "G" to the other terminal). The dense accumulation of red blood cells is shown between the three electrodes where the electric field gradient is high. The cells are clearly visible on top of the electrodes.

Electrical characteristics of a memristor device display a change in resistance of the device in response to voltage level the new value persists (non-volatile). This is referred to as resistive Random Access memory (RRAM). There is a lot of interest in the research and industry in developing computing platforms based on this type of technology to complement CMOS technology or as a stand-alone. The ability to support memory and perform computations on the same device is promising, which makes it attractive for artificial intelligence (AI) and big data applications—the reason being that there is no need to move data from memory to execution or a processing unit. A memristor is a type of resistive Random Access memory (RRAM) consisting of a thin oxide film which stores information with zero leakage current, has high endurance, relatively fast write time and small cell size. The two-terminal device has displays both storage and information processing capabilities, which make it a potential building block for in-memory computing (IMC).

Many changes, modifications, variations and other uses and applications of the subject invention will become apparent to those skilled in the art after considering this specification and the accompanying drawings, which disclose the preferred embodiments thereof. All such changes, modifications, variations and other uses and applications, which do not depart from the spirit and scope of the invention, are deemed to be covered by the invention, which is to be limited only by the claims which follow.

The invention claimed is:

1. A planar graphene oxide (GO)—based device, wherein the planar graphene oxide (GO)—based device comprises a memristor structure, the memristor structure comprising a plurality of two-terminal cells, each two-terminal cell comprising:
   a substrate, wherein the substrate has been treated with oxygen plasma;
   a hydroiodic acid-treated reduced graphene oxide (rGO) layer on the substrate, wherein the rGO layer has been formed by depositing a layer of graphene oxide (GO)

using a spin coater, the layer of GO then being chemically reduced to form the rGO layer by immersing the substrate in hydroiodic acid, wherein the hydroiodic acid-treated rGO layer has a reduced oxygen content and increased electrical conductivity; and two metal electrodes on top of the rGO layer;

an electrical behavior characterized in having at least three resistance levels in response to an applied voltage, wherein a clear distinction exists between consecutive resistance levels of the at least three resistance levels, such that the device can store data and be used as a multiple bit random access memory (RAM).

2. The planar graphene oxide (GO)-based device according to claim 1, wherein the electrical behavior enables the planar graphene oxide (GO)-based device to perform data processing.

3. The planar graphene oxide (GO)-based device according to claim 1, wherein the electrical behavior demonstrates a retention displayed by absence of overlap between consecutive I-V (current-voltage) sweeps.

4. The planar graphene oxide (GO)-based device according to claim 1, further comprising the at least three resistance levels in response to an applied voltage, wherein the planar graphene oxide (GO)-based device is capable of use as a multiple bit random access memory (RAM).

5. A multiple bit random access memory (RAM) comprising the planar graphene oxide (GO)-based device of claim 1.

\* \* \* \* \*